United States Patent [19]
Nakamura

[11] Patent Number: 5,730,616
[45] Date of Patent: Mar. 24, 1998

[54] IC SOCKET

[75] Inventor: Ryuichi Nakamura, Kawasaki, Japan

[73] Assignee: Yamaichi Electronics Co., Ltd., Tokyo, Japan

[21] Appl. No.: 684,940

[22] Filed: Jul. 19, 1996

[30] Foreign Application Priority Data

Jul. 25, 1995 [JP] Japan .................... 7-210071

[51] Int. Cl.[6] ................................... H01R 13/62
[52] U.S. Cl. ................................. 439/342; 439/268
[58] Field of Search ........................ 439/259, 263, 439/264, 268, 342

[56] References Cited

U.S. PATENT DOCUMENTS

| 3,315,212 | 4/1967 | Peterson | 439/342 |
| 3,345,604 | 10/1967 | Henschen et al. | 439/342 |
| 4,498,725 | 2/1985 | Bright et al. | 439/342 |
| 5,456,613 | 10/1995 | McHugh | 439/268 |
| 5,569,045 | 10/1996 | Hsu | 439/342 |

FOREIGN PATENT DOCUMENTS 3-39908  8/1991  Japan .

*Primary Examiner*—J. J. Swann
*Attorney, Agent, or Firm*—Wenderoth, Lind & Ponack

[57] ABSTRACT

An IC socket comprises socket board having a plurality of contacts for contacting corresponding lead terminals of an IC package, and a movable plate closed with respect to an upper surface of the socket board. The contacts are brought into contact with the corresponding lead terminals when the movable plate is laterally moved in one direction along the upper surface of the socket board, and the contacts are moved out of contact with the corresponding lead terminals when the movable plate is laterally moved in the other direction. The IC socket further comprises at least one block integrally formed on each of two opposite side edges of one of the movable plate and the socket board, which side edges are parallel with the lateral movement direction of the movable plate relative to the socket board. On each of the two opposite side edges, a pin is inserted into the at least one block so as to be fixed to and movable with the at least one block. At least one pin restricting piece is integrally formed on each of the opposite side edges of the other of the movable plate and the socket board, which side edges are parallel with the lateral movement direction of the movable plate relative to the socket board. The pin restricting pieces are respectively slidingly abutted against surfaces of the pins.

26 Claims, 4 Drawing Sheets

IC SOCKET

BACKGROUND OF THE INVENTION

1. Field of the Invention

This invention relates to an IC socket in which lead terminals of an IC package loaded on a movable plate laterally movably disposed on an upper surface of a socket board are brought into and out of contact with corresponding contacts implanted in the socket board by adequately controlling the lateral movement of the movable plate.

2. Brief Description of the Prior Art

A typical conventional IC socket of this type is disclosed, for example, by Japanese Utility Model Publication No. Hei 3-39908. This IC socket comprises a socket board having a plurality of contacts implanted therein and for contacting corresponding lead terminals of an IC package, a movable plate disposed on the socket board for lateral movement along an upper surface of the socket body, and a crank lever for controlling the lateral movement of this movable plate. The movable plate and the socket board are joined by a pin so that the movable plate is guided to make the intended lateral movement.

Specifically, the socket board has a pair of insertion blocks projecting from two opposite side edges of the socket board which side, edges are parallel with the lateral movement direction. On the other hand, a pin insertion block interposed between the blocks is designed to project from the movable plate. Holes formed in the pair of blocks are brought into alignment with each other, and a connecting pin is inserted into the aligned holes. By doing this, the movable plate is closed with respect to the socket board. A crank lever is operated so that the movable plate is laterally moved in one direction along an upper surface of the socket board to achieve electrical contact between the contacts and their corresponding IC lead terminals. This electrical contact between the contacts and their corresponding IC lead terminals is removed when the movable plate is laterally moved in the other direction.

The contacts can easily be replaced with new contacts simply by withdrawing the connecting pin and removing the movable plate.

According to the above-mentioned prior art, the blocks must be integrally formed with the socket board so that the holes formed in the blocks on the movable plate side is correctly in alignment with the corresponding hole formed in the socket board. However, it is actually impossible to avoid a certain degree of molding errors in a resin molding operation, and therefore, in practice the molded member will contain a certain number of accepted flaws. In the prior art, due to this type of molding error, the centers of the holes tend to be displaced laterally or vertically. Since this makes it difficult to correctly align the holes, the movable plate cannot be superimposed on the socket board in a correct manner. As a consequence, a desirable guide function for laterally moving the movable plate and a desirable warp preventive function of the movable plate are difficult to obtain. This leads to unreliability of electrical contact between the contacts and their corresponding IC lead terminals.

Moreover, there are encountered such problems that, due to incorrect alignment of the holes, it is difficult to insert the pin into the holes, and a complicated procedure for press fitting both the movable plate and the socket board into the block is required.

Furthermore, in the JP 3-39908 publication, there is a statement that the movable plate can easily be released and the contact can easily be recovered simply by inserting or withdrawing the pin from the hole. However, in actual practice, the pin can not easily be inserted and withdrawn because the pin must be inserted into and withdrawn from both the movable plate and the socket body. In addition, another problem is that the walls of the holes tends to be subjected to fatigue due to repeated insertion and withdrawal of the pin.

The present invention has been accomplished in order to effectively obviate the above-mentioned problems inherent in the prior art devices.

SUMMARY OF THE INVENTION

It is, therefore, an object of the present invention to provide an IC socket, in which a movable plate mounted on a socket board can be correctly laterally moved and guided.

Another object of the present invention is to provide an IC socket, in which contacts and IC lead terminals can correctly be brought into and moved out of contact with each other in a reliable manner.

A further object of the present invention is to provide an IC socket, in which a pin for guiding the lateral movement of the movable plate can easily be inserted into and withdrawn from a pin insertion hole.

A still further object of the present invention is to provide an IC socket, in which the movable plate can easily be opened and the contacts can easily be recovered.

In order to achieve the above objects, there is essentially provided, from one aspect of the invention, an IC socket comprising a socket board having a plurality of contacts for contacting corresponding lead terminals of an IC package, and a movable plate closed with respect to an upper surface of the socket board, the contacts being brought into contact with the corresponding lead terminals when the movable plate is laterally moved in one direction along the upper surface of the socket board and being moved out of contact with the corresponding lead terminals when the movable plate is laterally moved in the other direction. The IC socket further comprises at least one block integrally formed on each of two opposite side edges of the movable plate, which side edges are parallel with the lateral movement direction of the movable plate, and a pin inserted into the block with opposite end portions allowed to project respectively from opposite ends of the at least one block. At least one pin restricting piece is integrally formed on each of the side edges of the socket board, which side edges are parallel with the lateral movement direction of the movable plate. The pin restricting piece is abutted against an upper surface of the projecting opposite ends of the pin.

According to another aspect of the present invention, there is provided an IC socket comprising a socket board having a plurality of contacts for contacting corresponding lead terminals of an IC package, and a movable plate closed with respect to an upper surface of the socket board, the contacts being brought into contact with the corresponding lead terminals when the movable plate is laterally moved in one direction along the upper surface of the socket board and being moved out of contact with the corresponding lead terminals when the movable plate is laterally moved in the other direction. The IC socket further comprises a plurality of blocks spaced apart and integrally formed on each of two opposite side edges of the movable plate, which side edges are parallel with the lateral movement direction of the movable plate, a pin inserted into the blocks, and a pin restricting piece integrally formed on each of the side edges of the socket board, which side edges are parallel with the lateral movement direction of the socket board, the pin restricting piece being abutted against an upper surface of a part of the pin extending between the blocks.

According to another aspect of the invention, there is provided an IC socket comprising a socket board having a plurality of contacts for contacting corresponding lead terminals of an IC package, and a movable plate closed with respect to an upper surface of the socket board, the contacts being brought into contact with the corresponding lead terminals when the movable plate is laterally moved in one direction along the upper surface of the socket board and being moved out of contact with the corresponding lead terminals when the movable plate is laterally moved in the other direction. The IC socket further comprises a block integrally formed on each of two opposite side edges of the movable plate, which side edges are parallel with the lateral movement direction of the movable plate, a pin inserted into each block, and a pin restricting piece integrally formed on each of the side edge of the socket board, which side edges are parallel with the lateral movement direction of the movable plate. The pin restricting piece is abutted against lower surfaces of opposite end portions of the opposite ends of the block.

According to another aspect of the invention, there is provided an IC socket comprising a socket board having a plurality of contacts for contacting corresponding lead terminals of an IC package, and a movable plate closed with respect to an upper surface of the socket board, the contacts being brought into contact with the corresponding lead terminals when the movable plate is laterally moved in one direction along the upper surface of the socket board and being brought out of contact with the corresponding lead terminals when the movable plate is laterally moved in the other direction. The IC socket further comprises a plurality of blocks spaced apart and integrally formed on each of two opposite side edges of the socket board, which side edges are parallel with the lateral movement direction of the movable plate, a pin inserted into the blocks, and a pin restricting piece integrally formed on each of the side edges of the movable plate, which side edges are parallel with the lateral movement direction of the movable plate. The pin restricting piece is abutted against a lower surface of a part of the pin extending between the blocks.

The hole for allowing the pin to be inserted therein is, in one preferred form, of an elongated cross section in a direction perpendicular to the lateral movement direction of the movable plate.

The foregoing has outlined some of the more pertinent objects of the present invention. Those objects should be construed as being merely illustrative of some of the more prominent features and applications of the present invention. Many other beneficial results can be obtained by applying the disclosed invention in a different manner or modifying the invention within the scope of the invention. Accordingly, other objects and a full understanding of the invention may be had by referring to the detailed description of the embodiments in addition to the scope of the invention defined by the appended claims taken in conjunction With the accompanying drawings.

DETAILED DESCRIPTION OF THE EMBODIMENTS

Figure 1:
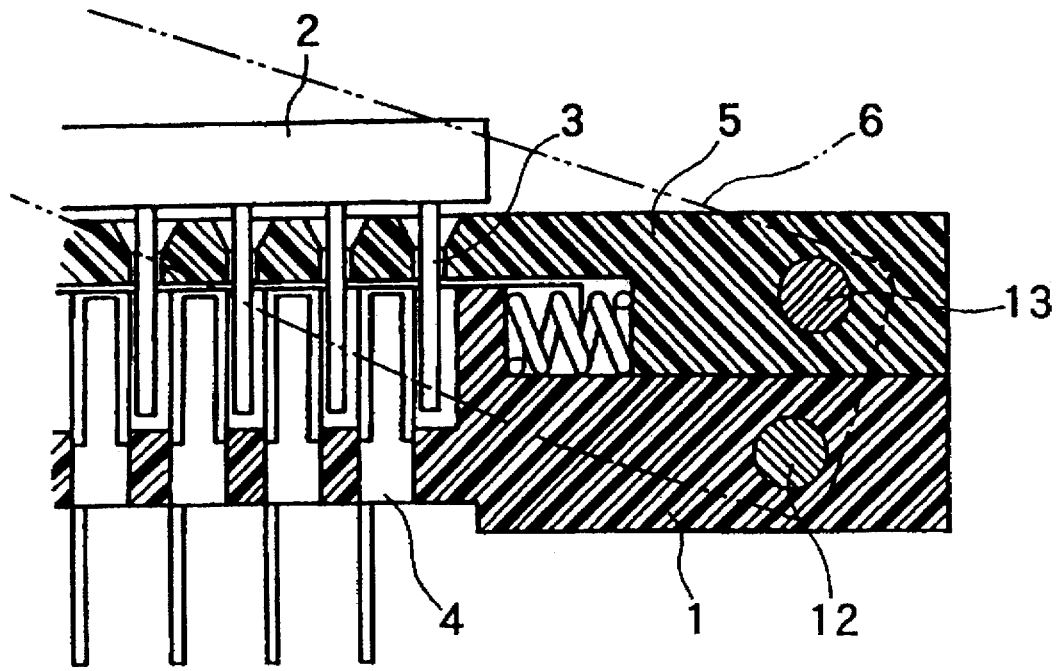
FIGS. 1(A) and 1(B) are sectional views showing a noncontacted state and a contacted state, respectively between lead terminals of an IC package and corresponding contacts.
Figure 1:
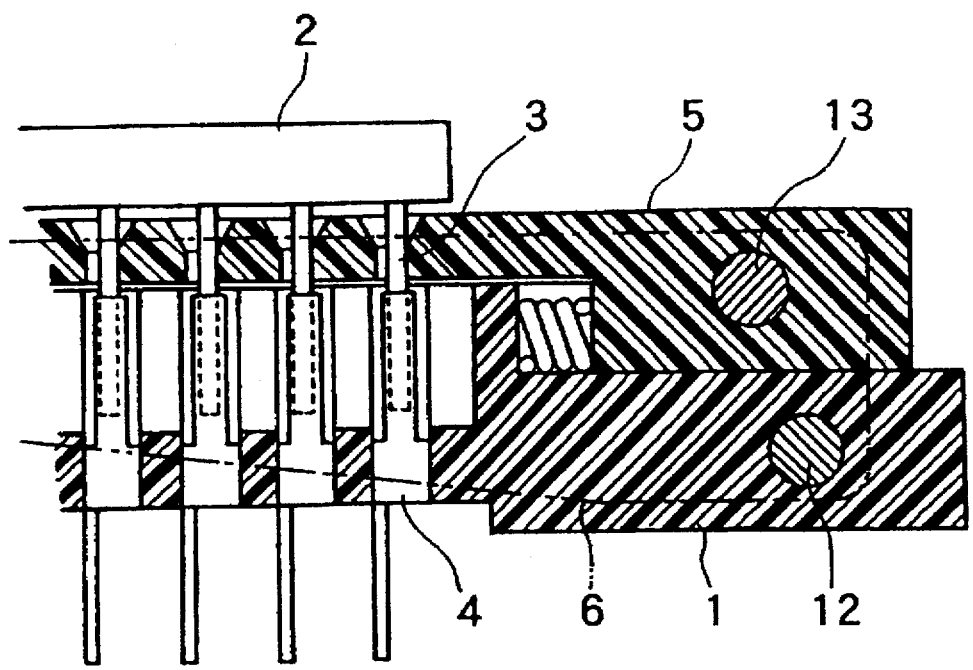

As shown in FIG. 1, an IC socket according to a first embodiment of the present invention comprises a socket board 1 having a plurality of contacts 4 arranged thereon and for contacting corresponding lead terminals 3 of an IC package 2, and a movable plate 5 closed against an upper surface of the socket board 1. The movable plate 5 is laterally movable in one direction along the upper surface of the socket board 1 by a camshaft or a known lever 6 as disclosed, for example, in Japanese Utility Model Publication No. Hei 3-39908. By this unidirectional lateral movement of the movable plate 5, the lead terminals 3 of the IC package 2 loaded on the movable plate 5 are brought into contact with corresponding contacts 4. By lateral movement in the other direction of the movable plate 5, the lead terminals 3 are moved out of contact with the corresponding contacts 4.

One end of the lever 6 is supported on the socket board 1 through a pin 12 and on the movable plate 5 through another pin 13. When the lever 6 is turned about the pin 12 as indicated by broken lines in FIGS. 1(A) and 1(B), the other pin 13 is moved about the first-mentioned pin 12 and as a result, the movable plate 5 is laterally moved.

Figure 2:
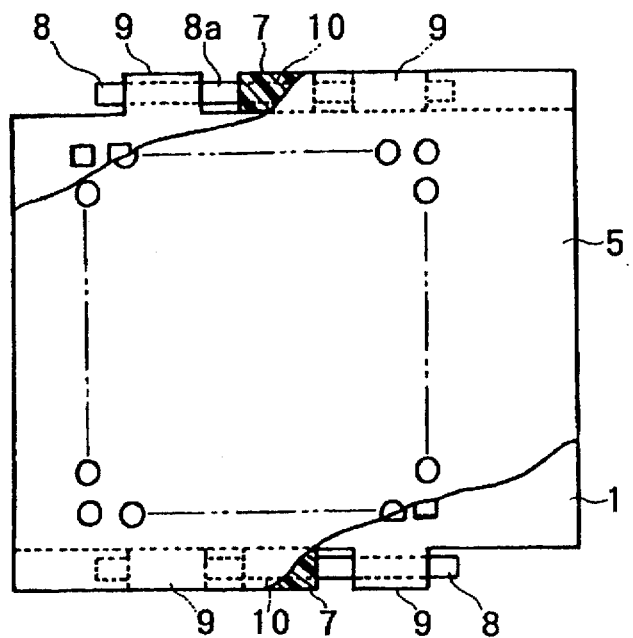
FIG. 2 is a plan view, partly cut-away, of an IC socket according to a first embodiment of the present invention.
Figure 3:
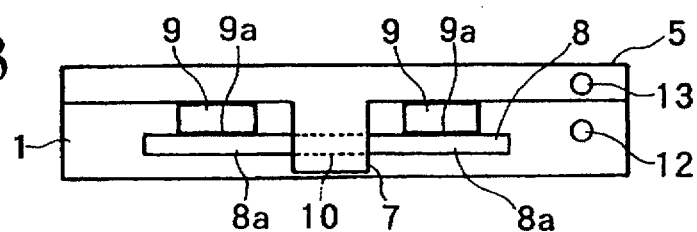
FIG. 3 is a side view of the IC socket of FIG. 2.
Figure 12:
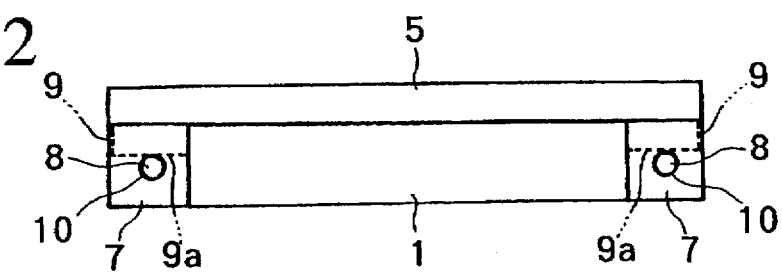
FIG. 12 is a front view, partly cut-away, of an IC socket, showing a state in which upper surfaces of pins in the first and second embodiments are regulated by regulating pieces.

FIGS. 2, 3 and 12 show the first embodiment of the present invention. In the illustrations, a pin insertion block 7 is integrally formed on each of two side edges of the movable plate 5, which side edges are in parallel with the lateral movement direction of the movable plate 5. An insertion hole 10 is formed in each block 7, and a pin 8 is inserted into this pin insertion hole 10 with opposite ends of the pin 8 projecting from opposite ends of the block 7.

More specifically, a pair of lugs (opposite side edges of the movable plate 5 parallel with the lateral movement direction of the movable plate 5) are allowed to project from opposite side edges of the socket board 1. The block 7 extends downwardly from a lower surface of each of the projected lugs along a side surface of the socket board 1, and the pin insertion hole 10 is formed in this block 7.

On the other hand, pin restricting pieces 9 are integrally formed respectively on opposite side edges of the socket board 1, which side edges are parallel with the lateral movement direction of the movable plate 5. The pin restricting pieces 9 are abutted with an upper surface of a pin portion 8a extending in the lateral movement direction of the movable plate 5 from opposite ends of each block 7.

Figure 4:
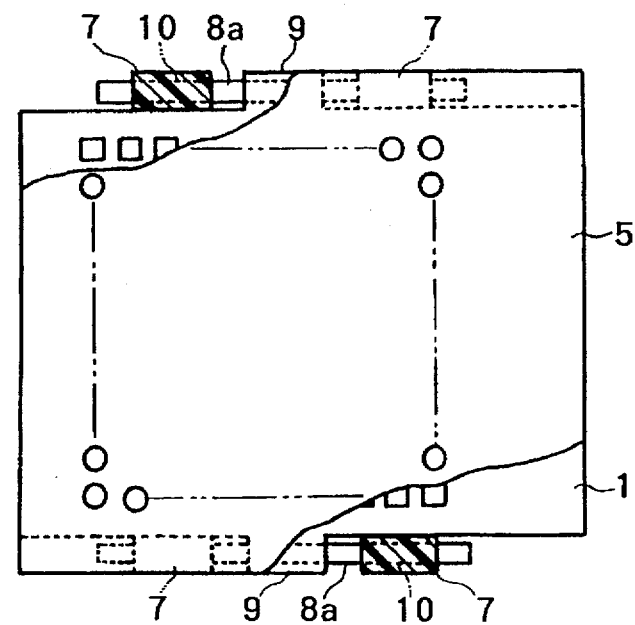
FIG. 4 is a plan view, partly cut-away, of an IC socket according to a second embodiment of the present invention.
Figure 5:
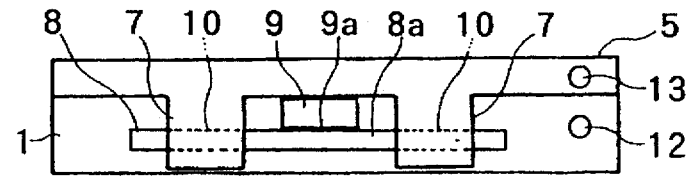
FIG. 5 is a side view of the IC socket of FIG. 4.

FIGS. 4 and 5 show a second embodiment of the present invention. In the illustrations, the pin insertion blocks 7 are spaced apart and integrally formed on each of opposite side edges of the movable plate, which side edges are parallel with the lateral movement direction of the movable plate 5. Each block 7 has a pin insertion hole 10. A pin 8 extends through these pin insertion holes 10 in parallel with the lateral movement direction of the movable plate 5 and between the two blocks 7. These blocks may be provided on the projected portions (lugs) of the movable plate 5 as in the first embodiment. This is likewise applicable to other embodiments.

On the other hand, the pin restricting pieces 9 are integrally formed on opposite side edges of the socket board 1, which side edges are parallel with the lateral movement direction of the movable plate 5. The pin restricting pieces 9 are abutted with the upper surface of the pin portion 8a extending between the two blocks 7.

Figure 10:
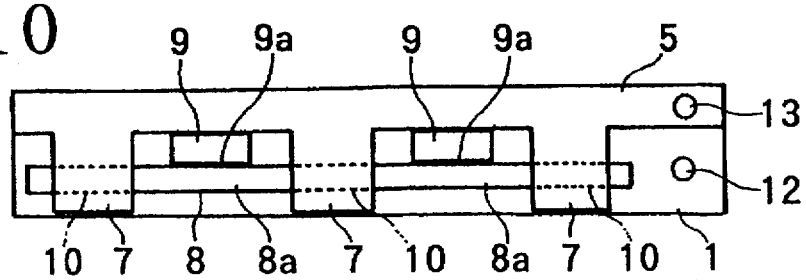
FIG. 10 is a side view of a modified embodiment of an IC socket in which features of both the first and second embodiments are employed.

FIG. 10 shows a modified embodiment of the present invention, in which a combination of the first and second embodiments is employed. As shown in FIG. 10, the pin insertion blocks 7 are integrally formed on opposite side edges of the movable plate 5, which side edges are parallel with the lateral movement direction of the movable plate 5. A central portion of the pin 8 is inserted through a central one of the blocks 7, and opposite ends of the pin 8 projecting from opposite ends of the central block 7 in the lateral movement direction of the movable plate 5 are inserted into the outer blocks 7 integrally formed on the opposite sides of the central block 7.

On the other hand, the pin restricting pieces 9 are integrally formed on each of the opposite side edges of the socket board 1, which side edges are parallel with the lateral movement direction of the movable plate 5, and the pin restricting pieces 9 are abutted with the upper surfaces of the pin portions 8a projecting from opposite ends of the blocks 7.

That is, by employing a combination of the first and second embodiments, there are provided the blocks 7 extending from the movable plate through the central portion and opposite end portions of the pin 8. Upper surfaces of the pin portions 8a extending between adjacent blocks 7 are restricted by the pin restricting pieces 9 which are provided on the socket board 1.

Figure 6:
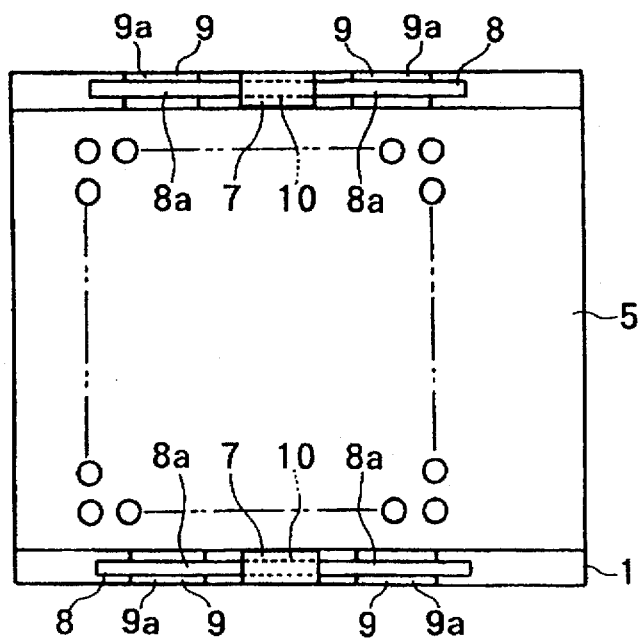
FIG. 6 is a plan view of an IC socket according to a third embodiment of the present invention.
Figure 7:
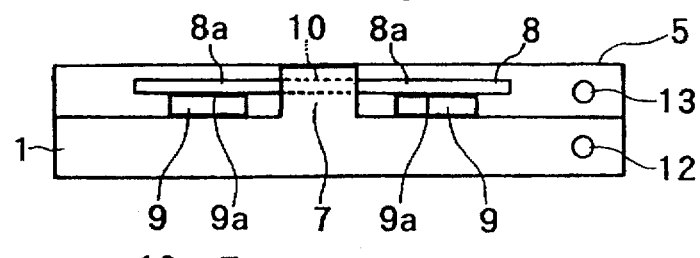
FIG. 7 is a side view of the IC socket of FIG. 6.

FIGS. 6 and 7 show a third embodiment of the present invention. In the illustrations, a pin insertion block 7 is integrally formed on each of the two opposite sides of the socket board 1, which sides are parallel with the lateral movement direction of the movable plate 5. A pin insertion hole 10 is formed in each block 7. A pin 8 is inserted through the block 7 with opposite ends of the pin 8 projecting in the lateral movement directions from opposite ends of the block 7.

On the other hand, a pin restricting piece 9 is integrally formed on each of two opposite side edges of the movable plate 5, which side edges are parallel with the lateral movement direction of the movable plate 5. These pin restricting pieces 9 are abutted with a lower surface of pin portions 8a projecting from opposite ends of the block 7.

Figure 8:
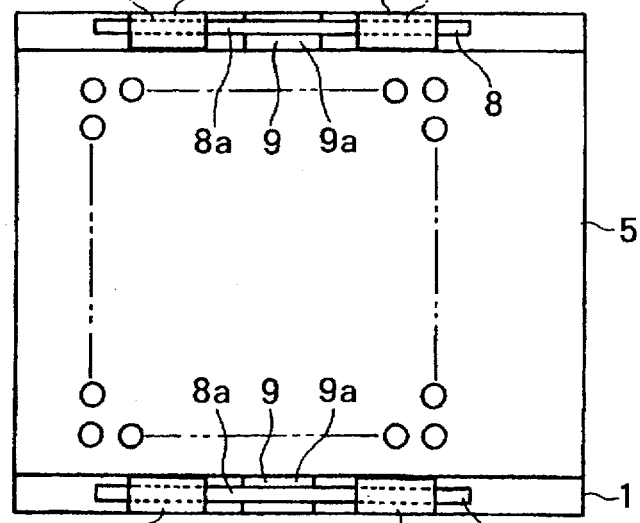
FIG. 8 is a plan view of an IC socket according to a fourth embodiment of the present invention.
Figure 9:
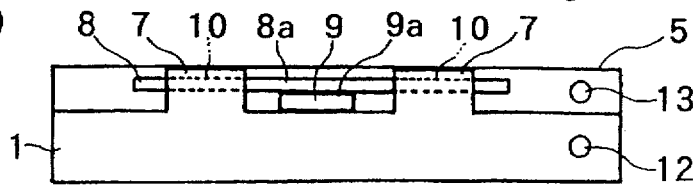
FIG. 9 is a side view of the IC socket of FIG. 8.

FIGS. 8 and 9 show a fourth embodiment of the present invention. In the illustrations, pin insertion blocks 7 are spaced apart and integrally formed on each of two opposite side edges of the socket board 1, which side edges are parallel with the lateral movement direction of the movable plate 5. Opposite ends of a pin 8 are inserted into the blocks 7. A pin portion 8a extends between adjacent blocks 7.

On the other hand, a pin restricting piece 9 is integrally formed on each of two opposite side edges of the movable plate 5, which side edges are parallel with the lateral movement direction of the movable plate 5. The pin restricting piece 9 is abutted against a lower surface of the pin portion 8a extending between the blocks 7.

Figure 11:
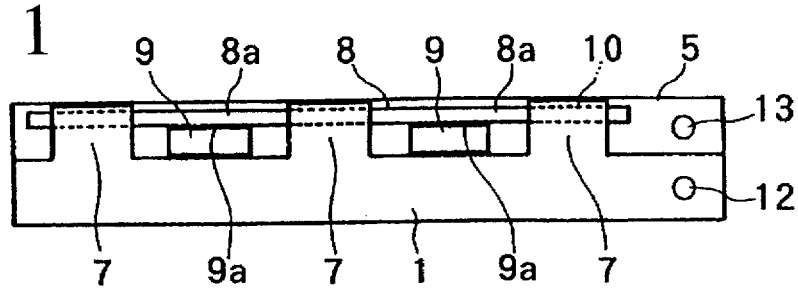
FIG. 11 is a side view of another modified embodiment of an IC socket in which features of both the third and fourth embodiments are employed.

FIG. 11 shows a modified embodiment of the present invention in which a combination of the third and fourth embodiments is employed. In the illustration, pin insertion blocks 7 are integrally formed on each of two opposite side edges of the socket board 1, which side edges are parallel with the lateral movement direction of the movable plate 5. An intermediate portion of the pin 8 is inserted through the blocks 7. Opposite ends of pin 8 projecting from opposite ends of the block 7 are inserted into the adjacent blocks 7, which blocks 7 are all integrally formed on each of two opposite side edges of the socket board 1. Accordingly, at least three blocks 7 are spaced apart along the lateral movement direction on each of the two opposite sides of the socket board 1.

On the other hand, pin restricting pieces 9 are integrally formed respectively on the two opposite side edges of the movable plate 5, which side edges are parallel with the lateral movement direction of the movable plate 5. The pin restricting pieces 9 are abutted with lower surfaces of pin portions 8a extending from opposite ends of the blocks 7, respectively. That is, by employing a combination of the third and fourth embodiments, the blocks 7 are provided which allow the central portion and opposite end portions of the pin 8 to extend therethrough. In addition, upper surfaces of the pin portions 8a extending between the adjacent blocks 7 are restricted by the pin restricting pieces 9 provided on the movable plate 5.

In the first and second embodiments, the pins 8 are moved together with the movable plate 5 when the movable plate 5 is laterally moved, so that the pins 8 serve as guides for the lateral movement of the movable plate 5. The pins 8 are press fitted into the blocks 7 or fixed to the blocks 7 by stop rings or the like.

In the third and fourth embodiments, the movable plate 5 laterally moves alone along the pins 8. The pins 8 are press fitted into the blocks 7 or fixedly secured to the blocks 7 by stop rings or the like so that the pins 8 will not move laterally relative to the blocks 7.

In the third and fourth embodiments, the movable plate 5 moves together with the pieces 9 such that the pieces 9 smoothly laterally slide against the surfaces of the pins. In the first and second embodiments, the movable plate 5 laterally moves together with the pins 8 such that the pins 8 slide against the pin restricting pieces 9. For this purpose, spaces exist between each block 7 and each pin restricting piece 9 for allowing the lateral movement of the movable plate 5.

The pin 8 used herein is a round pin made of metal. The blocks 7 and the pin restricting pieces 9 are formed integrally with the movable plate 5 or the socket board 1 from synthetic resin.

That surface of each pin restricting piece 9 which contacts the round pin 8 is designed to have a horizontal surface 9a, so that each of the pin restricting pieces 9 makes line contact with a generator (also known as generatrix) of one of the pins 8.

Figure 14:
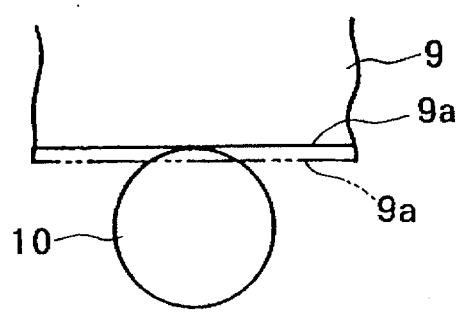
FIG. 14 is an explanatory view showing a correlation between pin insertion holes and pin regulating pieces.

Each pin restricting piece 9 is designed such that when it is abutted with the round pin 8, it creates a slight pushing force against the round pin 8. That is, a pressing surface of the pin restricting surface 9a is located either on a tangential line of the pin insertion hole 10 as indicated by a solid line of FIG. 14, or across an arc of the pin insertion hole 10 (i.e. slightly radially inward from the tangential line) as indicated by an imaginary line in FIG. 14. Accordingly, the pin restricting piece 9 slightly pushes the pin 8 downwardly (in the case with the first and second embodiments) or upwardly (in the case with the third and fourth embodiments), so that the movable plate 5 is superimposed upon the socket board 1 with no play, thereby ensuring a correct lateral movement of the movable plate.

Figure 13:
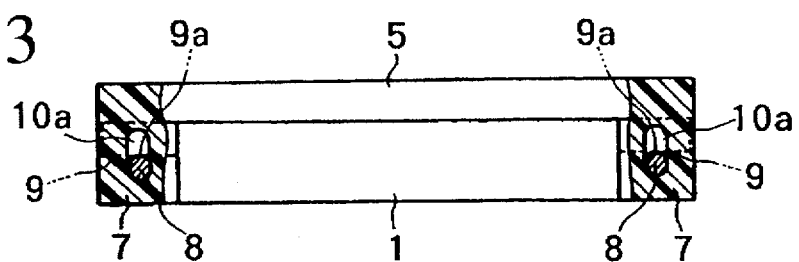
FIG. 13 is a front view, partly cut-away, of an IC socket, showing one embodiment in which holes for inserting pins therein consist of elongated holes, respectively.

In the respective modified embodiments in which a combination of the first and second embodiments and a combination of the third and fourth embodiments are employed, respectively, the hole 10 for allowing the pin 8 to be inserted therein may be designed as an elongated hole 10a extending in a direction perpendicular to the lateral movement direction of the movable plate 5 as shown in FIG. 13. In case the upper surfaces of the pins 8 are restricted by the pin restricting pieces 9, respectively, the lower surfaces of the pins 8 contact the lower ends of the elongated holes 10a, and the pin restricting pieces 9 contact the upper surfaces, respectively. Although not shown, in case the lower surfaces of the pins 8 are restricted by the pin restricting pieces 9, the upper surfaces of the pins 8 contact the upper ends of the elongated holes 10a, and the pin restricting pieces 9 contact the lower surfaces, respectively.

According to the present invention, it is possible to overcome such problems as inherent in the conventional devices in which the pin insertion holes of the blocks are not appropriately aligned with the pin insertion holes of the socket board and therefore, play and improper press fitting occur. As a consequence, there can be obtained a reliable smooth movement of the movable plate. This ensures highly reliable electrical contact and noncontact.

Furthermore, since the blocks are provided either on the movable plate or the socket board, centering of the pin insertion holes is easy, and the pin can comparatively easily be inserted in retracted out of the holes. Accordingly, by appropriately inserting the pin in and retracting it out of the corresponding pin insertion hole, the movable plate can be released and the contacts can be recovered.

Although the present invention has been described in its preferred forms with a certain degree of particularity, it should be understood that the present disclosure of the preferred forms has been made only by way of example and that numerous changes in the details of the construction and arrangement of parts may be resorted to without departing from the spirit and the scope of the invention as hereinafter claimed.

What is claimed is:

1. An IC socket including a socket board having opposite side edges and a plurality of contacts for contacting corresponding lead terminals of an IC package, and a movable plate closed with respect to an upper surface of said socket board and having opposite side edges parallel to said opposite side edges of said socket board, said contacts being movable into contact with the corresponding lead terminals when said movable plate is laterally moved in a first lateral direction, parallel to said opposite side edges of said socket board and said movable plate, along the upper surface of said socket board and being movable out of contact with the corresponding lead terminals when said movable plate is laterally moved in a second lateral direction opposite the first lateral direction, said IC socket further comprising:

a block integrally formed on each of said opposite side edges of one of said socket board and said movable plate;

a pin removably fixed to each said block and extending parallel to said opposite side edges of said socket board and said movable plate such that, upon moving of said movable plate relative to said socket board, said pin remains stationary relative to said block;

a plurality of pin restricting pieces integrally formed on each of said opposite side edges of the other of said socket board and said movable plate; and wherein each of said pin restricting pieces has a flat contact surface, and each said pin slidably contacts against said flat contact surfaces of said pin restricting pieces under pressure, so as to create line contact of each said pin with said pin restricting pieces along a line of intersection of a generatrix of said pin with said flat contact surfaces of said pin restricting pieces.

2. An IC socket as recited in claim 1, wherein said block is integrally formed on each of said opposite side edges of said socket board; and said pin restricting pieces are integrally formed on each of said opposite side edges of said movable plate.

3. An IC socket as recited in claim 2, wherein each said pin extends between and in sliding contact with said plurality of pin restricting pieces.

4. An IC socket as recited in claim 2, wherein each said block has a pin-insertion hole formed therethrough, and each said pin is received through said pin-insertion hole of one of said blocks.

5. An IC socket as recited in claim 4, wherein each said pin-insertion hole has a vertically elongated cross section.

6. An IC socket as recited in claim 1, wherein said block is integrally formed on each of said opposite side edges of said movable plate; and said pin restricting pieces are integrally formed on each of said opposite side edges of said socket board.

7. An IC socket as recited in claim 6, wherein each said pin extends between and in sliding contact with said plurality of pin restricting pieces.

8. An IC socket as recited in claim 6, wherein each said block has a pin-insertion hole formed therethrough, and each said pin is received through said pin-insertion hole of one of said blocks.

9. An IC socket as recited in claim 8, wherein each said pin-insertion hole has a vertically elongated cross section.

10. An IC socket as recited in claim 1, wherein each said pin extends between and in sliding contact with said plurality of pin restricting pieces.

11. An IC socket as recited in claim 1, wherein each said block has a pin-insertion hole formed therethrough, and each said pin is received through said pin-insertion hole of one of said blocks.

12. An IC socket as recited in claim 11, wherein each said pin-insertion hole has a vertically elongated cross section.

13. An IC socket as recited in claim 1, wherein each said pin has a central part and opposing end parts, and said central part is fixed to said block such that said end parts protrude on opposing sides of said block; and said end parts of each said pin slidably contact said flat contact surfaces of said pin restricting pieces.

14. An IC socket including a socket board having opposite side edges and a plurality of contacts for contacting corresponding lead terminals of an IC package, and a movable plate closed with respect to an upper surface of said socket board and having opposite side edges parallel to said opposite side edges of said socket board, said contacts being movable into contact with the corresponding lead terminals when said movable plate is laterally moved in a first lateral direction, parallel to said opposite side edges of said socket board and said movable plate, along the upper surface of said socket board and being movable out of contact with the corresponding lead terminals when said movable plate is laterally moved in a second lateral direction opposite the first lateral direction, said IC socket further comprising:

- a plurality of blocks integrally formed on each of said opposite side edges of one of said socket board and said movable plate;
- a pin removably fixed to each of said plurality of blocks and extending parallel to said opposite side edges of said socket board and said movable plate such that, upon moving of said movable plate relative to said socket board, said pin remains stationary relative to said blocks;
- a pin restricting piece integrally formed on each of said opposite side edges of the other of said socket board and said movable plate; and
- wherein each said pin restricting piece has a flat contact surface, and each said pin slidably contacts against said flat contact surface of said pin restricting piece under pressure, so as to create line contact of each said pin with said pin restricting piece along a line of intersection of a generatrix of said pin with said flat contact surface of said pin restricting piece.

15. An IC socket as recited in claim 14, wherein said blocks are integrally formed on each of said opposite side edges of said socket board; and said pin restricting piece is integrally formed on each of said opposite side edges of said movable plate.

16. An IC socket as recited in claim 15, wherein each said pin is removably fixed to and extends between one said plurality of said blocks.

17. An IC socket as recited in claim 15, wherein each of said blocks has a pin-insertion hole formed therethrough, and each said pin is received through said pin-insertion holes of one said plurality of said blocks.

18. An IC socket as recited in claim 17, wherein each said pin-insertion hole has a vertically elongated cross section.

19. An IC socket as recited in claim 14, wherein said blocks are integrally formed on each of said opposite side edges of said movable plate; and said pin restricting piece is integrally formed on each of said opposite side edges of said socket board.

20. An IC socket as recited in claim 19, wherein each said pin is removably fixed to and extends between one said plurality of said blocks.

21. An IC socket as recited in claim 19, wherein each of said blocks has a pin-insertion hole formed therethrough, and each said pin is received through said pin-insertion holes of one said plurality of said blocks.

22. An IC socket as recited in claim 21, wherein each said pin-insertion hole has a vertically elongated cross section.

23. An IC socket as recited in claim 14, wherein each said pin is removably fixed to and extends between one said plurality of said blocks.

24. An IC socket as recited in claim 14, wherein each of said blocks has a pin-insertion hole formed therethrough, and each said pin is received through said pin-insertion holes of one said plurality of said blocks.

25. An IC socket as recited in claim 24, wherein each said pin-insertion hole has a vertically elongated cross section.

26. An IC socket as recited in claim 14, wherein each said pin has a central part and opposing end parts, and said central part slidably contacts said pin restricting piece, and said end parts protrude on opposing sides of said pin restricting piece; and said end parts of each said pin are fixed to said blocks.

* * * * *